United States Patent
Zeller et al.

(10) Patent No.: US 11,841,409 B2
(45) Date of Patent: Dec. 12, 2023

(54) COMPUTER-IMPLEMENTED METHOD FOR OPERATING A MAGNETIC RESONANCE DEVICE, MAGNETIC RESONANCE DEVICE, COMPUTER PROGRAM, AND ELECTRONICALLY-READABLE STORAGE MEDIUM

(71) Applicant: Siemens Healthcare GmbH, Erlangen (DE)

(72) Inventors: Mario Zeller, Erlangen (DE); Flavio Carinci, Würzburg (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/849,130

(22) Filed: Jun. 24, 2022

(65) Prior Publication Data

US 2022/0413075 A1 Dec. 29, 2022

(30) Foreign Application Priority Data

Jun. 29, 2021 (EP) .................................... 21182299

(51) Int. Cl.
*G01R 33/483* (2006.01)
*G01R 33/54* (2006.01)

(52) U.S. Cl.
CPC ......... *G01R 33/4835* (2013.01); *G01R 33/54* (2013.01)

(58) Field of Classification Search
None
See application file for complete search history.

(56) References Cited

U.S. PATENT DOCUMENTS

| | | | |
|---|---|---|---|
| 2018/0095150 A1* | 4/2018 | Zeller | G01R 33/543 |
| 2018/0299524 A1 | 10/2018 | Feiweier | |
| 2019/0170842 A1* | 6/2019 | Sharma | G01R 33/4835 |
| 2020/0025850 A1* | 1/2020 | Zeller | G06T 5/50 |
| 2020/0341099 A1 | 10/2020 | Li et al. | |

OTHER PUBLICATIONS

Xiufeng Li et al.: "11Alternative Slice Acquisition Orders for High-Resolution MB-EPI PCASL Imaging with Background Suppression", Proceedings of the International Society for Magnetic Resonance in Medicine, ISMRM, 27th Annual Meeting and Exhibition, Montreal, Quebec, Canada, May 11-May 16, 2019; No. 4955; Apr. 26, 2019 (Apr. 26, 2019); XP040712339.

Cohen Ouri et al: "Optimized inversion-time schedules for quantitative T 1 measurements based on high-resolution multi-inversion EPI", Magnetic Resonance in Medicine; vol. 79, No. 4, Apr. 27, 2018 (Apr. 27, 2018); pp. 2101-2112; XP055862284; US; ISSN: 0740-3194; DOI: 10.1002/mrm.26889; URL:https://onlinelibrary.wiley.com/doi/full-XML/10.1002/mrm.26889>; 2018.

(Continued)

*Primary Examiner* — Jay Patidar
(74) *Attorney, Agent, or Firm* — Banner & Witcoff Ltd.

(57) ABSTRACT

The disclosure relates to techniques for determining an acquisition order identified with an acquired magnetic resonance data set, which comprises a total number of slices, using a simultaneous multislice technique.

13 Claims, 2 Drawing Sheets

(56) References Cited

OTHER PUBLICATIONS

Setsompop, Kawin et al.: "Blipped-Controlled Aliasing in Parallel Imaging for Simultaneous Multislice Echo Planar Imaging with Reduced g-Factor Penalty"; in: Magnetic Resonance in Medicine; vol. 67; pp. 1210-1224; 2012.
Olson, V. Daniel et al: "Analysis of errors in diffusion kurtosis imaging caused by slice crosstalk in simultaneous multi-slice imaging"; NMR in Biomedicine; vol. 32, No. 11, Aug. 6, 2019 (Aug. 6, 2019), XP055862735; ISSN: 0952-3480, DOI: 10.1002/nbm.4162; URL:https://onlinelibrary.wiley.com/doi/full-XML/10.1002/nbm.4162>.
Markus Barth et al: "Simultaneous multislice (SMS) imaging techniques : SMS Imaging"; Magnetic Resonance in Medicine.; vol. 75; No. 1; Aug. 26, 2015 ; pp. 63-81; XP055408927; ISSN: 0740-3194; DOI:10.1002/mrm.25897; URL:https://onlinelibrary.wiley.com/doi/epdf/10.1002/mrm.25897.
CMRR Multiband Sequence Slice Order, revision 1.1. Dec. 13, 2013, Center for Magnetic Resonance Research, University of Minnesota https://wiki.humanconnectome.org/download/attachments/40534057/CMRR_MB_Slice_Order.pdf.

* cited by examiner

COMPUTER-IMPLEMENTED METHOD FOR OPERATING A MAGNETIC RESONANCE DEVICE, MAGNETIC RESONANCE DEVICE, COMPUTER PROGRAM, AND ELECTRONICALLY-READABLE STORAGE MEDIUM

CROSS-REFERENCE TO RELATED APPLICATIONS

The present application claims the benefit of the filing date of Europe patent application no. EP 21182299.4, filed on Jun. 29, 2021, the contents of which are incorporated herein by reference in their entirety.

TECHNICAL FIELD

The disclosure concerns a computer-implemented method for operating a magnetic resonance device to acquire a magnetic resonance data set, which comprises a total number of slices, using a simultaneous multislice technique, wherein in each sequence section of a repetition sequence, which is repeated multiple times, magnetic resonance signals from a simultaneity number, which is equal to an acceleration factor, of at least two slices, which have been excited in this sequence section, are measured simultaneously. To determine an acquisition order, a collapsed slice number, determined as the total number of slices divided by the acceleration factor, of slice groups is determined, wherein the slices are numbered according to their spatial arrangement in at least one stacking direction and the slice groups are defined such that the slice numbers in each group differ by the collapsed slice number. The slice groups are numbered according to the lowest slice number among their slices, and slice groups are assigned to the sequence sections according to an interleaving scheme applied to the slice groups sorted by their slice numbers. The disclosure further concerns a magnetic resonance device, a computer program, and an electronically readable storage medium.

BACKGROUND

Magnetic resonance imaging is an established imaging modality, in particular for medical applications. Research activities today are mostly focused on image quality, but also on reduction of the relatively long acquisition times for acquiring a magnetic resonance data set. Different techniques for parallel imaging of multiple slices have been proposed in the art.

In particular, in simultaneous multi slice imaging, a simultaneity number of slices, which is equal to an acceleration factor, e.g. two or three, is at least essentially simultaneously excited, for example using a multi-band pulse. Then, the magnetic resonance signal from all slices is simultaneously read out as one single image. This is often called "collapsing" of the simultaneously required slices into one image. A review of simultaneous multi slice imaging (SMS) is, for example, found in an Article by Markus Barth et al. "Simultaneous Multi Slice (SMS) Imaging Techniques", Magn. Reson. Med 75 (2016), pages 63-81.

The magnetic resonance data for the simultaneously acquired slices may then be separated in post-processing by separation algorithms, e.g. slice GRAPPA, see the article by K. Setsompop et al., "Blipped-Controlled Aliasing in Parallel Imaging (blipped-CAIPI) for simultaneous multi-slice EPI with reduced g-factor penalty," Magn. Reson. Med. 67 (2012), pages 1210-1224.

SUMMARY

One problem that may occur in SMS imaging is slice crosstalk. This is due to the non-optimal slice excitation profiles, which usually are not perfect rectangular profiles. That is, when one slice is excited, the neighboring slices may also already be at least partially excited, which may lead to saturation if slices are acquired in temporal and spatial vicinity. If, for example, in one sequence section, a first slice is excited and, in the temporarily directly adjacent next sequence section, a spatially directly adjacent second slice is to be acquired, the second slice may be partially saturated. Such crosstalk effects may lead to artifacts, e.g. for acquisitions with small or no slice gap. For example, an already partially saturated slice may appear darker in the final magnetic resonance data set.

These crosstalk effects and hence artifacts often arise if the total number of slices to be acquired divided by the acceleration factor yields an even number. This is caused by the acquisition orders used in the state of the art. Usually, if slice groups each having the simultaneity number of slices are defined, wherein the slices in each group have a spatial distance of the total slice number divided by the acceleration factor (this number may be called the collapsed slice number), these slice groups are not assigned to the sequence sections of a repetition sequence (which usually has the collapse slice number of sequence sections) in an ascending or descending order of the slices, but an interleaving scheme is used such that during the repetition sequence, temporarily directly adjacently acquired slices have a spatial distance of at least one slice. In known techniques for determining an acquisition order, usually slices with an odd slice number are acquired first, and slices with an even slice number afterwards (assuming the slices are numbered according to their spatial arrangement in at least one stacking direction), or vice versa. However, since the repetition sequence is usually repeated multiple times, if the collapsed slice number is even, the slice group assigned to the last sequence section and the slice group assigned to the first sequence section usually have a pair of slices which are spatially directly adjacent. For example, if sixteen slices are acquired using an SMS acceleration factor of two, yielding a collapsed slice number of eight, the acquisition order would be:

(S1, S9), (S3, S11), (S5, S13), S7, S15), (S2, S10), (S4, S12), (S6, S14), (S8, S16).

Obviously, when repeating this repetition sequence, slice groups (S8, S16) and (S1, S9) would be acquired directly adjacent in time, wherein slices S8 and S9 are spatially directly adjacent.

A repetition of the repetition sequence may, for example, be necessary if different diffusion directions are to be measured or in BOLD experiments.

In the state of the art, solutions to this problem have already been proposed, which introduce additional interleaves in the slice reordering to prevent such crosstalk effects for even collapsed slice numbers. For example, such algorithms may check whether the collapsed slice number is even and then select an uneven increment to determine the interleaving scheme. That is, instead of using an increment of two between the slice numbers of temporarily adjacently acquired slice groups, an increment of three may be used.

However, experiments have shown that such algorithms only solve the most obvious artifacts. In particular, there may still be room for improvement regarding the signal to noise ratio (SNR).

It is an object of the current disclosure to provide an improved method for determining an acquisition order in simultaneous multi slice imaging, in particular regarding a further reduction of artifact and/or improved signal to noise ratio.

This object is achieved by providing a computer-implemented method, a magnetic resonance device, a computer program, and an electronically readable storage medium as described in the disclosure, including the claims.

In a method as initially described, according to the disclosure, the interleaving scheme is determined by:
  determining multiple different reordering schemes for the slice groups, and
  using at least one decision criterion, which describes at least an estimated slice crosstalk strength for the reordering schemes, to select one of the reordering schemes as the interleaving scheme.

According to the disclosure, the repetition sequence has the collapsed slice number of sequence sections such that one single slice group number can be assigned to each single sequence section. Usually, the total number of slices modulo the acceleration factor is zero. There are hence a great number of possibilities to distribute the slice groups to the sequence sections, from which at least some, which can be seen as candidate schemes for the interleaving scheme, are determined, namely the reordering schemes. In principle, such a reordering scheme as well as the interleaving scheme can be understood as being a series of slice group numbers in a time order. Since the slice group numbers are assigned according to the slice numbers, they describe a spatial relationship between the slices, such that it can be determined for each pair of neighboring slice groups in a reordering scheme how far the spatial distance between their slices is. This, in turn, is a measure for slice crosstalk effects. Additionally, as further described below, conclusions regarding the signal to noise ratio can be drawn. Based on this insight, the disclosure proposes to apply one or more decision criteria to the reordering schemes to select the one best suitable for optimal reduction of crosstalk artifacts and, preferably, an improvement of SNR.

In summary, a variety of slice group reordering schemes is pre-calculated and an optimal one is selected as the interleaving scheme based on pre-defined decision criteria. Hence, a reduced number of crosstalk artifacts occur, the image quality for SMS imaging can be improved, and a higher flexibility in choosing the number of slices is provided. In certain scenarios, an increase SNR can also be realized.

For instance, the reordering schemes may be determined for multiple different increasing increments between adjacent slice group numbers, wherein, to determine a reordering scheme for an increment:
  a) an initial number is set to one,
  b) starting with the initial number as a current number, repeatedly, the current number is added to the reordering scheme and the increment is added to the current number to determine a next current number, until the next current number is larger than the collapsed slice number,
  c) the last used initial number is increased by one and step b) is repeated with the new initial number, unless the new initial number has already been added to the reordering scheme.

Hence, in other words each reordering scheme consists of subseries of slice group numbers, wherein, in each subseries, adjacent slice group numbers differ by the increment. For example, increments may be chosen as all integer numbers from two to the number of collapsed slices minus one; however, since the last increment number in this interval only has one subseries (namely G1, collapsed slice number), whereafter the remaining slice numbers would follow with an increment of one, it is preferred to select the possible increments such that the number of subseries having only one slice group number is smaller than two.

It is noted that since each reordering scheme has a series length of the collapsed slice number, the reordering schemes, put below each other, can also be understood as a reordering table.

As already noted, reordering schemes may be determined for each increment from two to the collapsed slice number minus one, or, e.g., from two to half the collapsed slice number, in which case two one-member subseries whose slice group numbers have a difference of one are prevented at the end of the reordering schemes.

It is however noted that other techniques may, in principle, also be used to determine multiple possible reordering schemes.

In an embodiment of the current disclosure, for each reordering scheme, a series of difference numbers is calculated by:
  for each slice group number of the reordering scheme that is not the last slice group number of the reordering scheme, subtracting the slice group number from the following slice group number of the reordering scheme to calculate a subtraction number, wherein the subtraction number for the last slice group number is determined by subtracting the last slice group number from the collapsed slice number plus one, and
  determining the difference numbers by calculating the subtraction number modulo the collapsed slice number,
  wherein a first of the at least one decision criterion sorts out all reordering schemes whose series of difference numbers comprises a one.

As already indicated above, the difference between neighboring slice group numbers in a reordering scheme indicates the spatial distance between slices which are to be acquired adjacent in time, if the reordering scheme was employed to determine the acquisition order. The disclosure thus proposes to calculate difference numbers for each reordering scheme on which the following analysis may be based. Here, repetition of the repetition sequence is already included by also calculating a difference number for the last slice group number in each reordering scheme by subtracting it from the collapsed slice number plus one. For example, in the example of a total number of sixteen slices and an acceleration factor of two, in the reordering scheme relating to an increment of two, the last difference number for this reordering scheme would be one (nine minus eight). As, however, acquisition of two spatially directly adjacent slices directly adjacent in time would lead to crosstalk, difference numbers of one should be avoided anyways, so that the first decision criterion sorts out all reordering schemes whose series of difference numbers comprises a one.

For example, if only one reordering scheme remains after application of the first decision criterion, this reordering scheme is used as the interleaving scheme. Further, if no reordering schemes remain after application of the first decision criterion, the problem is marked as unsolvable (for example for a total number of eight slices and an acceleration number of two). For such unsolvable cases, a corresponding message may be output to the user of the magnetic resonance device, indicating that another total number of slices would be preferable.

However, in many cases more than one reordering scheme will remain after application of the first decision criterion. While it is in principle conceivable to randomly select one of these remaining ordering schemes, according to embodiments of the present disclosure, if multiple reordering schemes remain after application of the first decision criterion, a skewness factor describing the variation of the difference number along each remaining series is determined, wherein at least one second decision criterion sorts out all remaining reordering schemes whose skewness factor indicates a variation of larger than zero. It has been found that equal spatial distances between directly temporarily adjacently acquired slices further improve the image quality by increasing the signal to noise ratio (SNR). This is due to the fact that, in this manner, remaining crosstalk effects are essentially the same for all remaining slice groups. Hence, e.g. to maximize the signal to noise ratio, from the reordering schemes remaining after application of the second decision criterion, the one having the largest difference number is selected as the interleaving scheme.

In embodiments, the skewness factors may be determined for each remaining ordering scheme by:
  for each difference number except the last difference number, calculating a skewness value by subtracting the following difference number from the current difference number, wherein the last skewness value is calculated by subtracting the first difference number from the last difference number, and
  summing up the absolute values of the skewness values to calculate the skewness factor.

In other words, the skewness values are calculated by cyclically subtracting the next difference number from the previous difference number in a series. In this manner, a skewness factor of zero directly indicates a variation of zero along the series of difference numbers.

For example, if all reordering schemes are sorted out by the second decision criterion, at least one third decision criterion is used to choose an interleaving scheme from the sorted out reordering schemes. In a first embodiment, the at least third decision criterion may select the reordering scheme having the largest minimal difference number. In this, especially for slice stacks with a relatively low number of slices, the reordering with the largest minimal difference number in its series of difference numbers is chosen to minimize effects of remaining magnetization, i.e. crosstalk effects. However, in a second alternative embodiment, the reordering scheme having the largest mean difference number is chosen. This also gives advantageous results, since it may lead to a more regular spatial distance between sequence sections adjacent in time. Finally, in a third alternative, the reordering scheme having the smallest standard deviation of difference numbers, normalized by the mean difference number, is chosen as the interleaving scheme. That is, the standard deviation of slice distances normalized by the mean slice distance may be minimized This leads to the most uniform distribution of difference numbers between slices, but might lead to lower difference numbers, i.e. lower slice distances between acquisitions directly adjacent in time, which, in turn, may lead to a slightly increased SNR loss in tissue with long relaxation times.

While, in principle, this method for determining an interleaving scheme and thus an acquisition order may be targeted for cases in which the number of collapsed slices is even, it is, however, preferred if the determination of the interleaving scheme is applied for even and uneven collapsed slice numbers. That is, the approach described herein may also be employed in cases of odd collapsed slice numbers, where a conventional interleaving scheme with only two slice numbers spatial difference is typically used. If, however, the herein proposed method is used, patterns having larger spatial differences for sequence sections directly adjacent in time are determined, such that crosstalk effects may be reduced and the SNR may be improved.

It should be noted that the proposed method is very fast since the search space is limited to the number of reordering schemes analyzed. It can replace known approaches and even outperform them, e.g. regarding the maximization of spatial distances between temporarily adjacent acquisitions. It should further be noted that, in cases where multiple alternatives exist, for example regarding a third decision criterion, all these decision criteria may be available, such that one can be selected based on at least one acquisition parameter of the planned magnetic resonance data set and/or user input. For example, if there are long relaxation times, the first or second alternative regarding the third decision criterion may be preferred over the third alternative.

The disclosure further concerns a magnetic resonance device, comprising a control device configured to perform a method according to the disclosure. All features and remarks regarding the method according to the disclosure analogously apply to the magnetic resonance device according to the disclosure, such that the same advantages can be achieved.

For example, the control device may comprise at least one processor and/or at least one storage means. Hardware and/or software components may be used to implement functional units for realizing steps of the current disclosure. As known in the art, the control device may comprise a sequence unit configured to perform the imaging, e.g. also using an acquisition order determined using the current disclosure to acquire the magnetic resonance data set. Furthermore, the control device may comprise a grouping unit configured to determine the collapsed slice number and the slice groups, a determination unit configured to determine the reordering schemes, a decision unit configured to evaluate the decision criteria and selecting one of the reordering schemes as the interleaving scheme, and an assignment unit configured to assign slice groups to sequence sections according to the interleaving scheme.

A computer program according to the disclosure can be directly loaded into a control device of a magnetic resonance device and comprises any suitable program means to perform the steps of a method according to the current disclosure if the computer program is executed on the control device of the magnetic resonance device. The computer program may be stored on an electronically readable storage medium according to the disclosure, which thus comprises control information such that, when the electronically readable storage medium is used in a control device of a magnetic resonance device, the control device of the magnetic resonance device is enabled to perform the steps of a method according to the disclosure. The electronically readable storage medium may be a non-transient computer-readable medium, for example a CD-ROM.

BRIEF DESCRIPTION OF THE DRAWINGS/FIG.URES

Other objects and features of the present disclosure will become apparent from the following detailed description considered in conjunction with the accompanying drawings. The drawings, however, are only principle sketches designed solely for the purpose of illustration and do not limit the disclosure. The drawings show:

DETAILED DESCRIPTION

Figure 1:
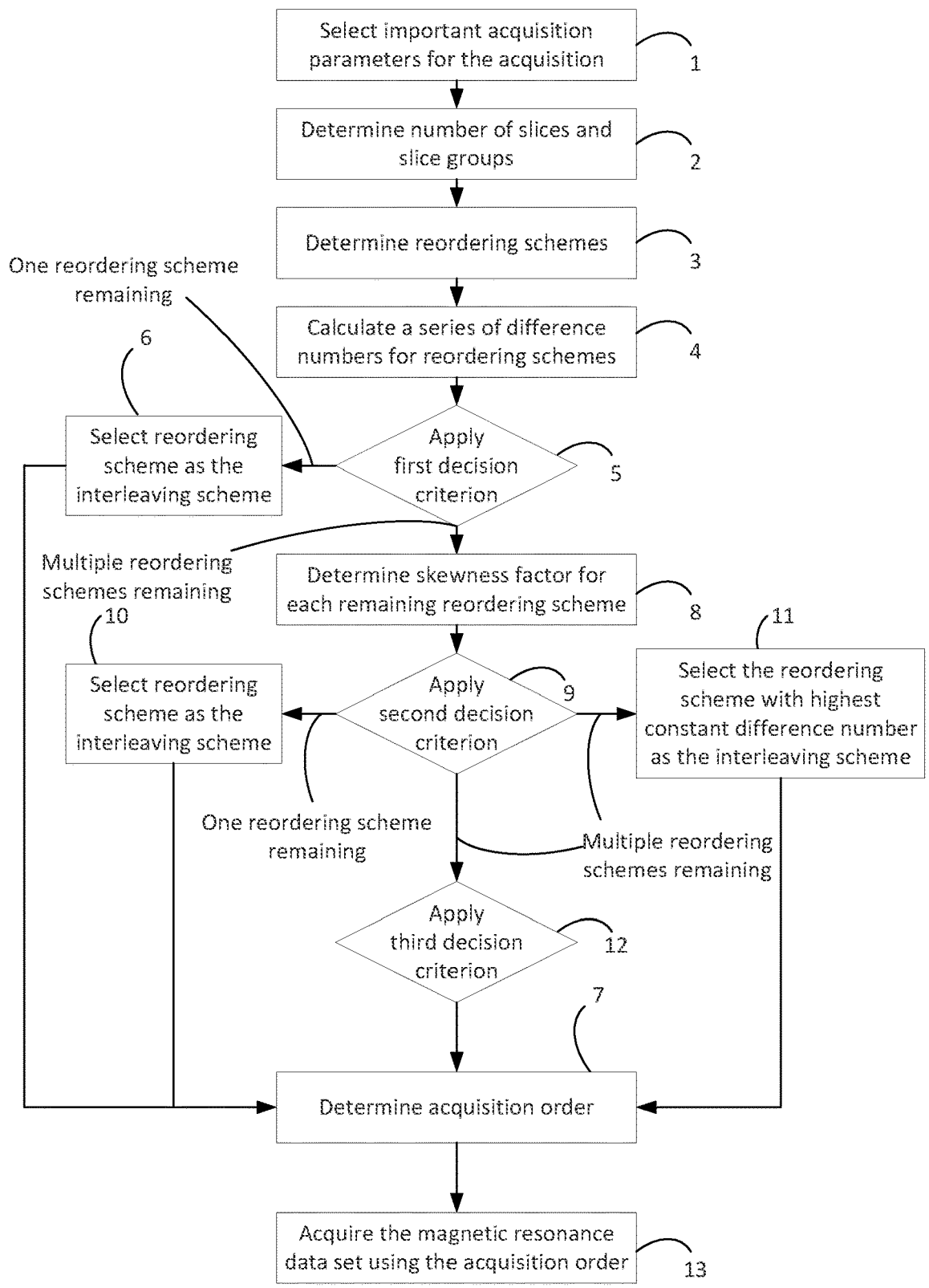
FIG. 1 illustrates an example flow chart of a method according to an embodiment of the disclosure.

FIG. 1 is a flow chart of an embodiment of a method according to the disclosure. The method serves to acquire a magnetic resonance data set using an SMS imaging technique with an acceleration factor, which may, for example, be two or three. In the following concrete examples, an acceleration factor of two is used.

In a step 1, a user selects important acquisition parameters for the acquisition, for example by choosing a certain acquisition protocol and/or manually entering acquisition parameters. For example, the total number of slices and the acceleration factor are chosen. This means that, if, for example, the total number of slices is sixteen and the acceleration factor is two, eight slice groups of two slices each may be defined in step 2. Generally, first a collapsed slice number N is calculated as the total number of slices divided by the acceleration factor. Then, N slice groups are determined, wherein the slices are numbered according to the spatial arrangement in at least one stacking direction and the slice groups are defined such that the slice numbers in each group differ by N. The slice groups, again, are numbered according to the lowest slice number among their slices. For the example of a total number of sixteen slices and an acceleration factor of two, as discussed above, N is equal to eight and the slice groups, sorted according to their slice group number are:

(S1, S9), (S2, S10), (S3, S11), (S4, S12), (S5, S13), (S6, S14), (S7, S15), (S8, S16).

All these slice groups and hence all slices S1 to S16 are, in this case, acquired in one repetition sequence, which is repeated multiple times. That is, the repetition sequence comprises N sequence sections, to which the slice groups one to N are to be assigned. Since there should be a spatial distance of at least one non-excited slice between temporarily directly adjacent sequence sections to prevent cross-talk, an interleaving scheme is to be determined according to which the slice groups are assigned to the sequence sections (ordered in time).

According to the approach presented here, in a step 3, multiple different reordering schemes, which are candidate schemes for the interleaving scheme, are first determined. In this embodiment, reordering schemes are calculated for different increments s ranging from s=1 to s=N−1. To achieve this, in a first substep it is started with the first slice group, for example i=1, and the next initial number (start index) is set to n=i+1. In a second substep, i as the current number is written to the current reordering scheme, which is a time-sorted series of slice groups numbers. In a third substep, i is incremented by the increment s. In a fourth substep, if i is greater N, i is set equal to n, and n is incremented by one. In a fifth substep, it is continued with the second substep until the reordering scheme has N entries. All reordering schemes can be determined at the same time, of course, for example as a reordering table. For the example of N is eight, the following reordering table results, in which the reordering schemes are in the rows.

1 2 3 4 5 6 7 8
1 3 5 7 2 4 6 8
1 4 7 2 5 8 3 6
1 5 2 6 3 7 4 8
1 6 2 7 3 8 4 5
1 7 2 8 3 4 5 6
1 8 2 3 4 5 6 7

It is noted that the first reordering scheme for the increment s=1 is shown for clarity. As can be seen, starting with the fourth row at the end of the reordering schemes, differences of only one occur so that the number of reordering schemes to be determined can be further reduced to, for example, half the collapsed slice number N.

In a next step 4 according to FIG. 1, a series of difference numbers is calculated for each of the reordering schemes. As a table, this could also be seen as a difference map of the reordering table. In this embodiment, to calculate such a difference map having the series of difference numbers in the rows, a current column c of slice group numbers is subtracted from the following column c+1 of slice group numbers for all column 1 to N−1, while the column N of slice group numbers is subtracted from N+1. Then, for each of those subtraction numbers, the modulo of N is taken, such that for the example of N=8, the following "difference map" results, which has the series of difference numbers in its respective rows.

1 1 1 1 1 1 1 1
2 2 2 3 2 2 2 1
3 3 3 3 3 3 3 3
4 5 4 5 4 5 4 1
5 4 5 4 5 4 1 4
6 3 6 3 1 1 1 3
7 2 1 1 1 1 1 2

In a step 5, a first decision criterion is applied, namely, all the ordering schemes having at least one difference number equal to one in their series of difference numbers are removed. If, now, no reordering schemes remain, the problem is considered unsolvable and a respective notice is output to the user.

If, however, only one reordering scheme remains, in a step 6, this reordering scheme is chosen as the interleaving scheme such that the acquisition order can be determined in a step 7. If, however, multiple reordering schemes remain, the method continues in step 8 to prepare the application of further decision criteria.

In the example described with respect to N=8, only one row remains from the difference map, namely the third row column 3 3 3 3 3 3 3 3

Since, for the case N=8, the optimal solution has already been found using the first decision criterion, it is now continued with an example for N=14, where there are four reordering schemes, namely:

1 4 7 10 13 2 5 8 11 14 3 6 9 12
1 5 9 13 2 6 10 14 3 7 11 4 8 12
1 6 11 2 7 12 3 8 13 4 9 14 5 10
1 7 13 2 8 14 3 9 4 10 5 11 6 12 or, in terms of difference numbers:

3 3 3 3 3 3 3 3 3 3 3 3 3 3
4 4 4 3 4 4 4 3 4 4 7 4 4 3
5 5 5 5 5 5 5 5 5 5 5 5 5 5
6 6 3 6 6 3 6 9 6 9 6 9 6 3 left after the first decision criterion.

For such a case, in which multiple reordering schemes and thus series of difference numbers remain after application of the first decision criterion, in a step 8, a skewness factor is determined for each of the remaining reordering schemes and their series of difference numbers. Hence, in step 8, a skewness map or table may first be determined from the difference map or table by cyclically subtracting the following column from the current column for all columns one to N, that is, the first column is subtracted from the last column. The results are skewness values, whose absolute values are then summed up to yield skewness factors for each row. In the example of N=14 above, the skewness map would be:

0 0 0 0 0 0 0 0 0 0 0 0 0 0
0 0 1 −1 0 0 1 −1 0 −3 3 0 1 −1
0 0 0 0 0 0 0 0 0 0 0 0 0 0
0 3 −3 0 3 −3 −3 3 −3 3 −3 3 3 −3 and the perspective skewness factors would be:

0
12
0
36.

These skewness factors are now evaluated by a second decision criterion, which sorts out all remaining reordering schemes whose skewness factor is not equal to zero in step 9. Here, three options exist. If exactly one reordering scheme remains, in a step 10, this reordering scheme is selected as the interleaving scheme. If, however, multiple reordering schemes remain after application of the second decision criterion in step 9, in a step 11, the one having the highest constant difference number is selected as the interleaving scheme. In the example of N is fourteen above, the reordering scheme having a constant difference number of five (third row) is selected.

However, it may also be possible that no reordering schemes remain after applying the second decision criterion in step 9. In this case, in a step 12, a third decision criterion is applied. Here, three options exist, wherein the applied third decision criterion in step 12 may be chosen by a user and/or depending on other acquisition parameters.

In a first option, the third decision criterion may, for example for slice stacks with a relatively low total number of slices, select the reordering scheme with the largest minimal difference number in the difference map, to minimize effects of the remaining magnetization. In an example, for N=16 according to this first alternative of the third decision criterion, a reordering scheme having a series of difference numbers of 6 6 5 6 6 5 6 6 5 6 6 5 6 11 6 5 would be selected as the interleaving scheme.

In a second alternative for the third decision criterion, the preferred reordering scheme can be determined by maximizing the mean difference number, which would, for an example of N=16, yield the reordering scheme having a series of difference numbers 7 7 3 7 7 3 7 10 7 10 7 10 7 10 7 3 as the interleaving scheme.

Finally, in a third alternative for the third decision criterion, the standard deviation of difference numbers normalized by the mean difference number may be minimized This leads to the most uniform distributions of difference numbers between sequence sections, but may be less preferable for long relaxation times, since shorter time distances between adjacent slices may result. For the example of N=16, the reordering scheme having a series of difference numbers 3 3 3 3 3 2 3 3 3 3 5 3 3 3 3 2 would be chosen as the interleaving scheme.

Once the interleaving scheme has been chosen, as already mentioned, in a step 7, the acquisition order may be finally determined and, in a step 13, the magnetic resonance data set may be acquired using this acquisition order.

It is noted that the method described here may be e.g. applied to both odd and even collapsed slice numbers, since, in an easy and fast manner, optimized interleaving schemes may be determined.

Figure 2:
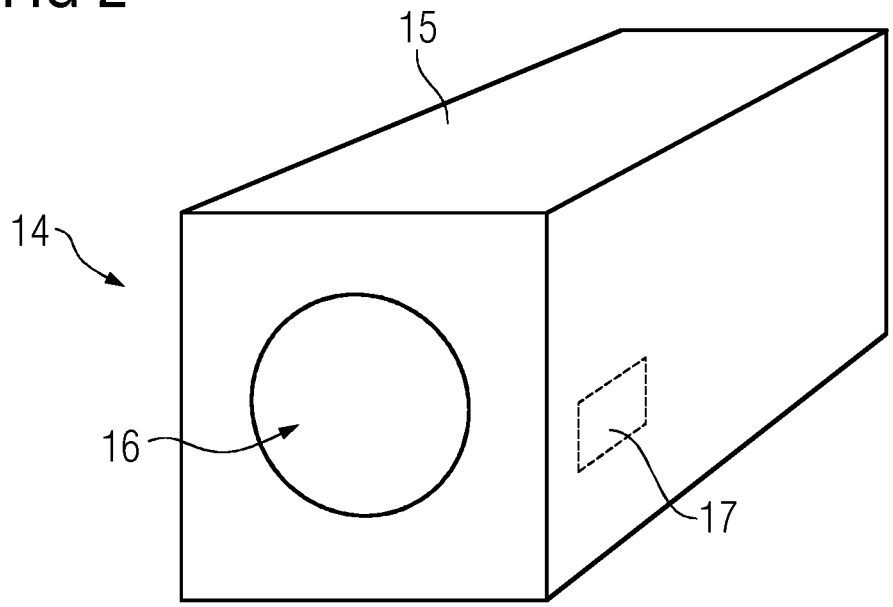
FIG. 2 illustrates an example magnetic resonance device according to an embodiment of the disclosure.

FIG. 2 shows a principle drawing of a magnetic resonance device 14 according to the disclosure. As in principle known, the magnetic resonance device 14 comprises a main magnet unit 15 having a cylindrical bore 16, in which a patient on a patient table (not shown) may be received. Surrounding the bore 16, a radio frequency coil arrangement and a gradient coil arrangement may be provided, as in principle is known. The operation of the magnetic resonance device 14 is controlled by a control device 17, which is also configured to perform a method according to the disclosure.

Figure 3:
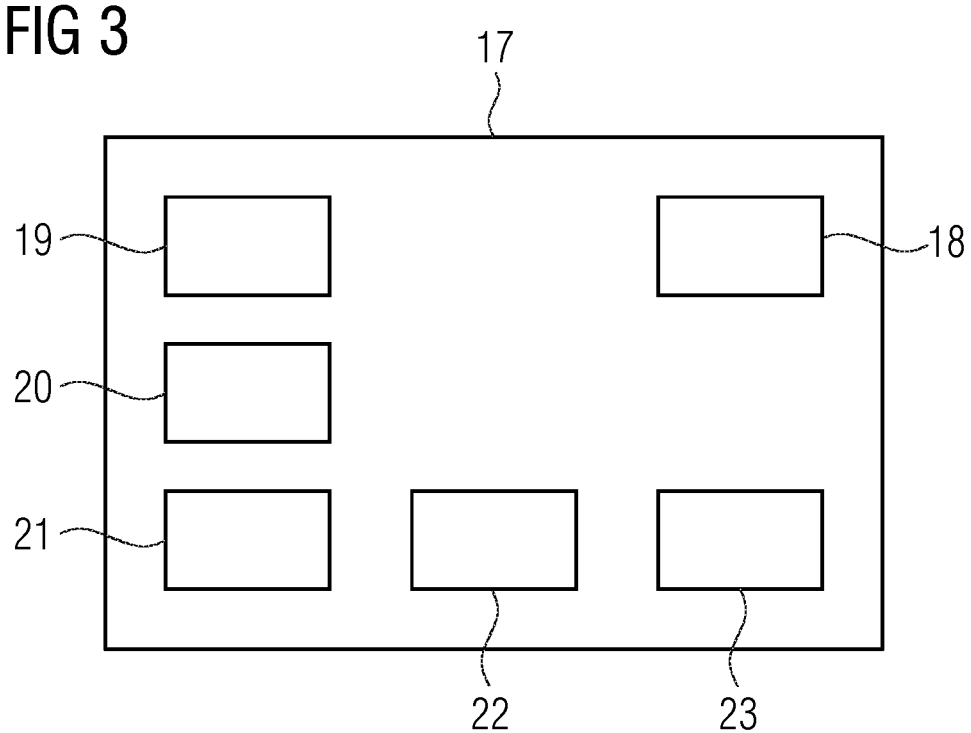
FIG. 3 illustrates an example functional structure of a control device of the magnetic resonance device according to an embodiment of the disclosure.

FIG. 3 shows the functional structure of the control device 17. The control device 17 comprises at least one storage means 18 in which, for example, acquisition parameters, reordering schemes in a reordering table, series of difference numbers in a difference table, skewness factors and the like as well as other information pertinent to operating the magnetic resonance device 14 may be stored. As principally known, the control device 17 comprises a sequence unit 19 controlling the acquisition of magnetic resonance data sets, e.g. also according to step 13 using the determined acquisition order. To determine the interleaving scheme and thus the acquisition order, the following functional units may also be implemented.

In a grouping unit 20, the collapsed slice number N and the slice groups may be determined according to step 2. In a determination unit 21, the reordering schemes may be determined according to step 3; in this embodiment, also the series of difference numbers according to step 4 is determined using the determination unit 21.

In a decision unit 22, the interleaving scheme is chosen from among the reordering schemes according to steps 5, 6 and 8 to 12. In an assignment unit 23, the slice groups may be assigned to the sequence sections of the repetition sequence according to the chosen interleaving scheme, see step 7.

Although the present disclosure has been described in detail with reference to the preferred embodiment, the present disclosure is not limited by the disclosed examples from which the skilled person is able to derive other variations without departing from the scope of the disclosure.

The various components described herein may be referred to as "devices" or "units." As noted above, such components may be implemented via any suitable combination of hardware and/or software components as applicable and/or known to achieve the intended respective functionality. This may include mechanical and/or electrical components, processors, processing circuitry, or other suitable hardware components configured to execute instructions or computer programs that are stored on a suitable computer readable medium. Regardless of the particular implementation, such devices es and units, as applicable and relevant, may alternatively be referred to herein as "circuitry," "processors," or "processing circuitry."

What is claimed is:

1. A computer-implemented method to determine an acquisition order in accordance with operating a magnetic resonance device to acquire a magnetic resonance data set that comprises a total number of slices using a simultaneous multislice technique, the method comprising:

simultaneously measuring, in each sequence section of a repetition sequence that is repeated multiple times, magnetic resonance signals from a simultaneity number that is equal to an acceleration factor of at least two, slices that have been excited in a respective sequence section;

determining a collapsed slice number of slice groups as a total number of slices divided by the acceleration factor, the slices being numbered according to their spatial arrangement in at least one stacking direction, and the slice groups being defined such that the slice numbers in each respective slice group differ by the collapsed slice number, the slice groups being numbered according to a lowest slice number among their respective slices; and assigning slice groups to the sequence sections according to an interleaving scheme applied to the slice groups sorted by their respective slice numbers, wherein the interleaving scheme is determined by (i) determining multiple different reordering schemes for each one of the slice groups, and (ii) using at least one decision criterion, which describes at least an estimated slice crosstalk strength for each of the multiple different reordering schemes, to select one of the reordering schemes as the interleaving scheme.

2. The method according to claim 1, wherein the multiple different reordering schemes are determined for multiple different increasing increments between adjacent slice group numbers, and wherein a reordering scheme from among the multiple different reordering schemes for a respective increment is determined by:
 a) setting an initial number to one,
 b) starting with the initial number as a current number, repeatedly adding the current number to the reordering scheme, and adding the increment to the current number to determine a next current number until the next current number is larger than the collapsed slice number, and
 c) increasing the last used initial number by one and repeating step b) with the next current number, unless the next current number has already been added to the reordering scheme.

3. The method according to claim 2, wherein respective reordering schemes from among the multiple different reordering schemes are determined for each increment (i) from two to the collapsed slice number minus one, or (ii) from two to half the collapsed number.

4. The method according to claim 1, wherein, for each reordering scheme from among the multiple different reordering schemes, a series of difference numbers is calculated by:
 for each slice group number of a respective reordering scheme that is not the last slice group number, subtracting the slice group number from the following slice group number of the respective reordering scheme to calculate a subtraction number,
 wherein the subtraction number for the last slice group number is determined by subtracting the last slice group number from the collapsed slice number plus one; and
 determining the series of difference numbers by calculating the subtraction number modulo the collapsed slice number,
 wherein a first one of the at least one decision criterion sorts out all reordering schemes having a series of difference numbers comprises a one.

5. The method according to claim 4, wherein, if only one reordering scheme remains after application of the first decision criterion, the respective reordering scheme is used as the interleaving scheme, and
 wherein, if no reordering schemes remain after application of the first decision criterion, the determination of the acquisition order is marked as unsolvable.

6. The method according to claim 4, wherein, if multiple reordering schemes remain after application of the first decision criterion, a skewness factor describing a variation of the difference number along each remaining series is determined, and
 wherein a second decision of the at least one decision criterion sorts out all remaining reordering schemes with a skewness factor indicating a variation larger than zero.

7. The method according to claim 6, wherein the skewness factors are determined for each remaining reordering scheme by:
 for each difference number along each remaining series except a last difference number, calculating a skewness value by subtracting a following difference number from a current difference number, the last skewness value being calculated by subtracting a first difference number from a last difference number, and
 summing absolute values of the skewness values along each remaining series to calculate the skewness factor.

8. The method according to claim 6, wherein, from the reordering schemes remaining after application of the second decision criterion, the reordering scheme having the largest difference number is selected as interleaving scheme.

9. The method according to claim 6, wherein, if all reordering schemes from among the multiple different reordering schemes are sorted out by the second decision criterion, a third decision criterion of the at least one decision criterion is used to select an interleaving scheme from the sorted out reordering schemes.

10. The method according to claim 9, wherein the third decision criterion is used to select, as the interleaving scheme, one of:
 a reordering scheme from among the sorted out reordering schemes having a largest minimal difference number;
 a reordering scheme from among the sorted out reordering schemes having a largest mean difference number; or
 a reordering scheme from among the sorted out reordering schemes having a smallest standard deviation of difference numbers, normalized by a mean difference number.

11. The method according to claim 1, wherein the determination of the interleaving scheme is applied for even and uneven collapsed slice numbers.

12. A magnetic resonance device, comprising:
 a main magnet unit; and
 processing circuitry configured to determine an acquisition order in accordance with operating the magnetic resonance device to acquire a magnetic resonance data set that comprises a total number of slices using a simultaneous multislice technique by:
 simultaneously measuring, in each sequence section of a repetition sequence that is repeated multiple times, magnetic resonance signals from a simultaneity number that is equal to an acceleration factor of at least two, slices that have been excited in a respective sequence section;
 determining a collapsed slice number of slice groups as a total number of slices divided by the acceleration factor, the slices being numbered according to their spatial arrangement in at least one stacking direction, and the slice groups being defined such that the slice numbers in each respective slice group differ by the collapsed slice number, the slice groups being numbered according to a lowest slice number among their respective slices; and
 assigning slice groups to the sequence sections according to an interleaving scheme applied to the slice groups sorted by their respective slice numbers, wherein the interleaving scheme is determined by (i) determining multiple different reordering schemes for each one of the slice groups, and (ii) using at least one decision criterion, which describes at least an estimated slice crosstalk strength for each of the multiple different reordering schemes, to select one of the reordering schemes as the interleaving scheme.

13. A non-transitory computer-readable medium having instructions stored thereon that, when executed by processing circuitry identified with a magnetic resonance device, cause the magnetic resonance device to determine an acquisition order in accordance with operating the magnetic resonance device to acquire a magnetic resonance data set that comprises a total number of slices using a simultaneous multislice technique by:

simultaneously measuring, in each sequence section of a repetition sequence that is repeated multiple times, magnetic resonance signals from a simultaneity number that is equal to an acceleration factor of at least two, slices that have been excited in a respective sequence section;

determining a collapsed slice number of slice groups as a total number of slices divided by the acceleration factor, the slices being numbered according to their spatial arrangement in at least one stacking direction, and the slice groups being defined such that the slice numbers in each respective slice group differ by the collapsed slice number, the slice groups being numbered according to a lowest slice number among their respective slices; and assigning slice groups to the sequence sections according to an interleaving scheme applied to the slice groups sorted by their respective slice numbers, wherein the interleaving scheme is determined by (i) determining multiple different reordering schemes for each one of the slice groups, and (ii) using at least one decision criterion, which describes at least an estimated slice crosstalk strength for each of the multiple different reordering schemes, to select one of the reordering schemes as the interleaving scheme.

* * * * *